United States Patent
Schaper et al.

(10) Patent No.: US 6,313,441 B1
(45) Date of Patent: Nov. 6, 2001

(54) CONTROL SYSTEM AND METHOD FOR PROVIDING VARIABLE RAMP RATE OPERATION OF A THERMAL CYCLING SYSTEM

(75) Inventors: Charles D. Schaper, Union City; Hooman Bolandi, Santa Clara; Douglas W. Young, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/432,286

(22) Filed: Nov. 2, 1999

Related U.S. Application Data

(63) Continuation-in-part of application No. 09/377,365, filed on Aug. 18, 1999.

(51) Int. Cl.[7] .................................................. F27B 5/14
(52) U.S. Cl. .................... 219/390; 219/411; 118/724; 392/416
(58) Field of Search ................................ 219/390, 405, 219/411; 118/724, 725, 50.1; 392/416, 418

(56) References Cited

U.S. PATENT DOCUMENTS 5,156,820 * 10/1992 Wong et al. .................... 422/186.05
6,080,969 * 6/2000 Goto et al. .................... 219/444.1

FOREIGN PATENT DOCUMENTS 40-3135011 * 6/1991 (JP) .

* cited by examiner

Primary Examiner—Teresa Walberg
Assistant Examiner—Shawntina S. Fuqua
(74) Attorney, Agent, or Firm—Dugan & Dugan

(57) ABSTRACT

A control system and method for variable ramp rate operation of a heater or integrated heating and cooling plate is provided. The control system obtains a calibration signal for a specific thermal cycling profile and for a specific heater, by exposing a calibration wafer having temperature sensors coupled thereto to a predetermined thermal cycling profile. During the calibration process, the temperature sensed by one or more sensors positioned on the heater, or on a thermally conductive plate coupled to the heater is recorded, as is the signal output to the heater. Preferably the position of the wafer relative to the heating mechanism, and the flow of cooling fluid to the heating mechanism are also recorded as part of the calibration signal. When the calibration signal is executed during production processing, the heating mechanism, fluid flow and/or lift pin position can be adjusted based on feedback from the temperature sensors positioned on the heater or on the conductive plate.

25 Claims, 4 Drawing Sheets

CONTROL SYSTEM AND METHOD FOR PROVIDING VARIABLE RAMP RATE OPERATION OF A THERMAL CYCLING SYSTEM

This application is a continuation-in-part of U.S. patent application Ser. No. 09/377,365, filed on Aug. 18, 1999, titled "INTEGRATED BAKE AND CHILL PLATE".

FIELD OF THE INVENTION

The present invention relates generally to methods and apparatuses for providing thermal cycling for processing substrates. More particularly, it relates to a control system for variable ramp rate operation of a heater or integrated heating/cooling plate.

BACKGROUND OF THE INVENTION

Certain stages of semiconductor manufacturing require thermal cycling of the semiconductor substrate wherein the substrate is heated and then chilled. For example, the photoresist processing stage of semiconductor manufacturing requires heating to flow the photoresist material along the substrate surface, followed by cooling or chilling the substrate to set the photoresist. In order to produce high quality wafers suitable for state of the art integrated circuit applications, the temperature of the wafer during thermal cycling must be precisely controlled with respect to both the temporal temperature profile of the thermal cycles and the uniformity of the temperature across the substrate.

Conventional methods for heating and chilling wafers involve first baking the wafer at a temperature ranging typically between 70° C. and 250° C. for a period of time ranging typically between 30 seconds and 90 seconds. After baking the wafer, the wafer is then mechanically moved to a cold plate where it is chilled to a temperature ranging typically between 0° C. and 30° C. Disadvantages of the conventional methods for heating and chilling wafers include the inability to control temperature variations at the wafer surface during the transfer between plates and/or between processing stations, and the potential for wafer damage from physical mishandling or contamination during transfer.

Recent developments for heating and chilling wafers involve thermal cycling modules where a wafer is heated and chilled on one plate, thus eliminating the need to move the wafer between plates. In such a thermal cycling module, the wafer is placed on a thermal conduction plate which is thermally coupled to a heating and cooling device. The heating and cooling device is controlled by a controller which is programmed with the desired thermal cycling profile (e.g., heating to 80° C. for 10 seconds, increase temperature to 200° C. for 10 seconds, followed by cooling to 10° C. for 30 seconds, etc.) for processing the wafer.

To achieve precise temperature control at the wafer, a plurality of sensors (e.g., thermocouple sensors or infrared sensors) are generally connected as described in parent application Ser. No. 08/939,926, to provide feedback to the controller regarding the temperature at the wafer surface. While the programmed thermal cycling profile for a given wafer may have fixed temperature and duration values, the wafer temperature ramp rates for different stages of the thermal cycling profile, for different wafer-bearing plates, and for the processing of different wafers, can vary drastically resulting in quality variations in the wafers processed thereby.

Accordingly, a need exists for an improved control system for controlling wafer temperature ramp rates during processing within thermal cycling systems.

SUMMARY OF THE INVENTION

The present invention provides a heater and a control system coupled thereto which can adjust wafer temperature dynamically based on information from temperature sensors positioned proximate the wafer. The control and feedback system includes a program for controlling both the temperature of a thermally conductive heating/cooling plate, and the proximity of the wafer to the heating/cooling plate. Preferably the program also includes optional methods for increasing and/or decreasing the overall processing time. Specifically, a heater is provided in thermal contact with the substrate being processed, where thermal contact includes, but is not limited to the following: an arrangement in which the substrate is brought into physical contact with the top surface of the heater; an arrangement in which the substrate is disposed on a thermally conductive plate which is coupled so as to exchange heat with the heater; or, an arrangement in which the substrate is supported at a small distance above either the top surface of the heater or the top surface of the thermally conductive plate (e.g., by substrate lift pins). The substrate is supported by pins coupled to a pin actuator for adjusting the distance between the substrate and the top surface of the heater.

The heater comprises a heating mechanism which is connected, through heater actuator circuitry, to the controller. Additionally connected to the controller, and responsive to input therefrom, are the pin actuator for adjusting the distance between the substrate and the top surface of either the heater or the thermally conductive plate, and a pump operatively coupled to a fluid spray component for providing cooling fluid (e.g., water) to the bottom surface of the heater. Temperature sensors, disposed proximate to the substrate being processed (e.g., on the top surface of the heater or if a thermally conductive plate is employed, on the top surface of the thermally conductive plate), provide feedback to the controller which controls processing according to a pre-programmed thermal cycling profile and which adjusts processing in response to feedback from the temperature sensor.

In operation, the heater is calibrated by placing a calibration wafer having sensors attached thereto, on the heater and adjusting the variable components of the system (e.g., the heater actuator, the pin actuator and the pump operation) based on the wafer sensor readings to achieve a predetermined thermal cycling profile. To obtain a calibration signal the controller records the signals output to the variable components, in addition to the temperature sensed by the temperature sensors positioned on the heater, or thermally conductive plate. When obtaining a calibration signal, a user may specify a desired processing speed (e.g., fast, slow or standard speed), and the controller will adjust the variables accordingly. During production processing, the controller executes the calibration signal and makes any necessary adjustments thereto based on feedback from the sensors positioned on the heater or thermally conductive plate. Should the temperature sensed by the heater/plate sensors vary from that experienced during the calibration process, the controller adjusts the variable components so as to maintain the calibration temperature of the heater/plate.

Thus, the inventive control system allows wafer temperature to be precisely controlled, eliminating thermal cycling induced variations in wafer quality. Further, chamber throughput may be increased by selecting a fast operating speed which increases the wafer temperature ramp rate by initially raising the heater temperature above the desired substrate temperature, so as to quickly heat the substrate and/or by initially decreasing the heater temperature below the desired substrate temperature so as to quickly cool the substrate.

Other objects, features and advantages of the present invention will become more fully apparent from the following detailed description of the preferred embodiments, the appended claims and the accompanying drawings.

DETAILED DESCRIPTION OF THE PREFERRED EMBODIMENT

Figure 1A:
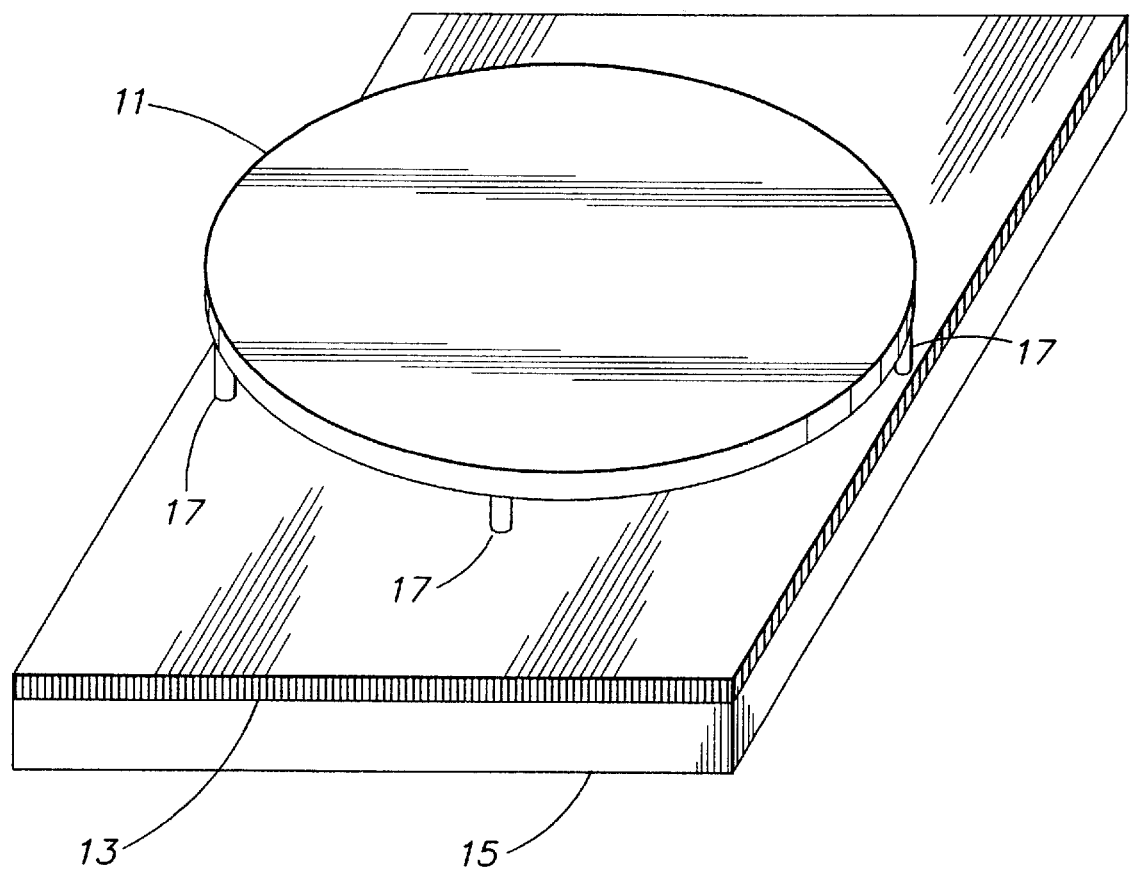
FIGS. 1A and 1B are perspective views of placement of a substrate in thermal contact with a heater in accordance with one aspect of the invention.
Figure 1B:
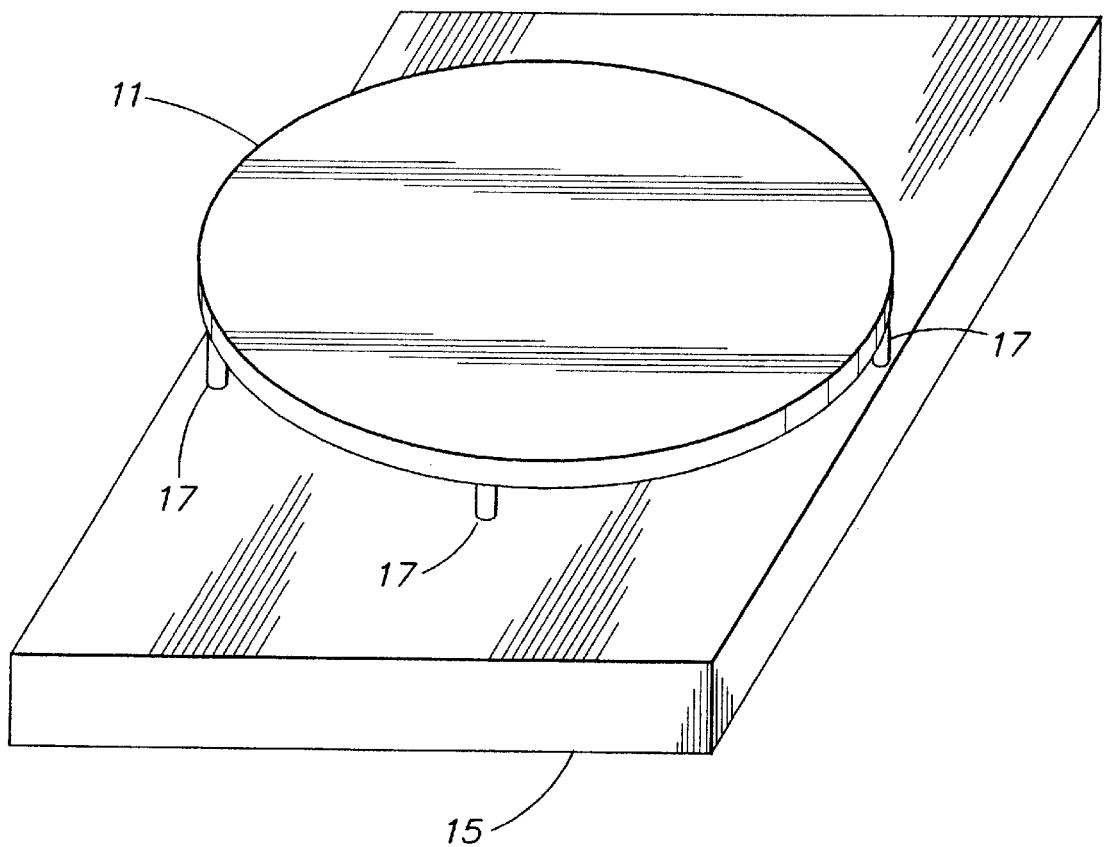

FIGS. 1A and 1B are perspective views of placement of a substrate, such as a semiconductor wafer or flat panel display, in thermal contact with a heater. The illustrated substrate is a wafer, and the ensuing description will refer to wafer processing, although all substrates are clearly envisioned. As depicted in FIG. 1A, wafer 11 is placed in thermal contact with thermal conduction plate 13 which, in turn, is placed in thermal contact with heater 15. Thermal contact includes physical proximity, or direct or indirect physical contact sufficient to permit the transfer of heat. Thermal conduction plate 13 is preferably made of a ⅛ or 3/16 inch thick piece of aluminum, aluminum nitride, or other suitable thermally conductive material. A plurality of pins 17 coupled to a pin actuator (shown at 29 in FIG. 2), pass through openings in heater 15 and in thermal conduction plate 13, preferably with no physical contact between the pins and the sides of the openings. The pins 17 are ideally fabricated of a thermally insulative material, such as Teflon™, so that no localized heat conduction will be experienced in the vicinity of the pins.

FIG. 1B provides a perspective view of an alternative wafer support arrangement in which thermal conduction plate 13 is omitted, otherwise the embodiment of FIG. 1B is identical to that of FIG. 1A. Further description is therefore omitted.

Figure 2:
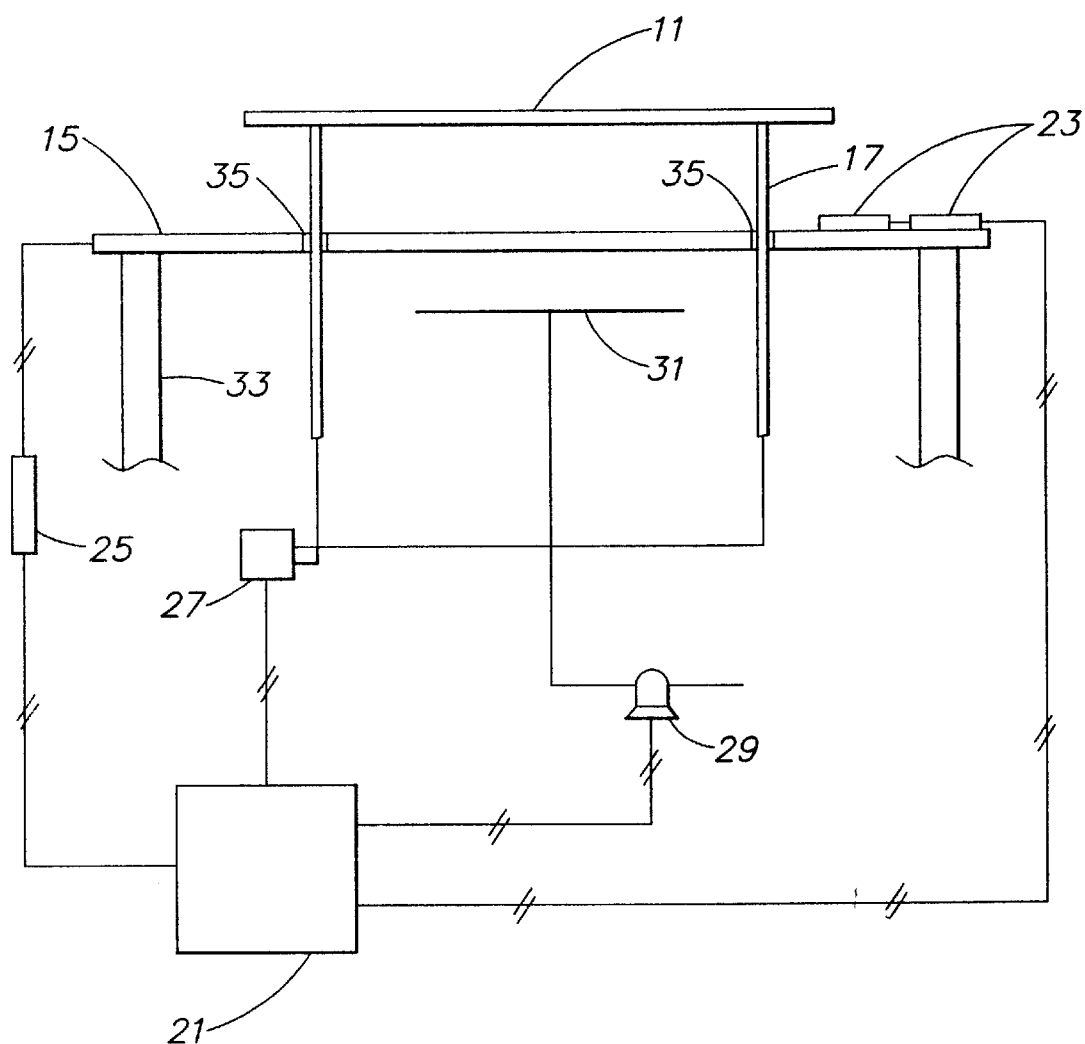
FIG. 2 is a schematic representation of a multivariable thermal cycling control system in accordance with the present invention.

FIG. 2 is a schematic diagram of the inventive multivariable thermal cycling control system for processing substrates. A controller 21 is connected to receive input from sensor(s) 23 which are coupled to the top surface of the heater 15 or, if the thermally conductive plate 13 is employed, to the top surface of the thermally conductive plate 13. For simplicity, the remaining description will assume the thermally conductive plate 13 is omitted. The controller 21 is further connected to supply input to three components: the heater actuator 25, the pin actuator 27, and the pump 29, which are provided to actuate connected components (the heater 15, the pins 17 and a fluid spray component 31, respectively) to vary processing conditions and thereby to affect the wafer temperature ramp rate.

The wafer 11 is supported by the pins 17 and is disposed in thermal contact with the top surface of the heater 15 (e.g., so that the heater heats the substrate by conduction or convection). Heater supports 33 are shown in partial view and are not pertinent to the invention. Openings 35 are provided in the heater 15 through which the wafer support pins 17 pass. There is, as noted previously, no thermal conduction between the wafer support pins 17 and the heater 15 and preferably no physical contact therebetween as well.

The wafer support pins 17 are connected to the pin actuator 27, which in turn is connected to receive input from the controller 21 to adjust the distance between the wafer 11 and the heater 15. The wafer support pins 17 may alternatively support the wafer 11 above a thermal conduction plate (not shown), as illustrated in FIG. 1A.

The controller 21 is connected to provide input to the pump 29, which controls the fluid spray component 31. Cooling fluid is sprayed from the fluid spray component 31 to the bottom surface of the heater 15 to lower the temperature of the heater 15. The pump 29 adjusts the amount of fluid spray and, (via a conventional temperature adjustment component (not shown) such as a water heater or water cooler) adjusts the temperature of the cooling fluid, in response to input from the controller 21, based on both the predetermined thermal cycling profile and on the actual temperature of the heater 15 or the thermally conductive plate 13 as sensed by the sensors 23. The fluid spray component 31 may be fixedly mounted with respect to the heater 15 or may be movably mounted to selectively deliver cooling fluid to certain areas of the heater 15. In an embodiment in which the fluid spray component 31 is movably mounted, an additional fluid spray component positioning mechanism (not shown) would be connected to receive positioning input from the controller 31.

The heater actuator 25 is disposed between the controller 21 and the heater 15 to receive temperature control input from the controller 21. The heater 15 is preferably configured in accordance with that described in U.S. patent application Ser. No. 09/432,287, filed Nov. 2, 1999, (AMAT No. 3033/PRP/DV) entitled IMPROVED HEATER FOR USE IN SUBSTRATE PROCESSING, filed herewith, and assigned to the present assignee, the entire disclosure of which is hereby incorporated by this reference.

Figure 3:
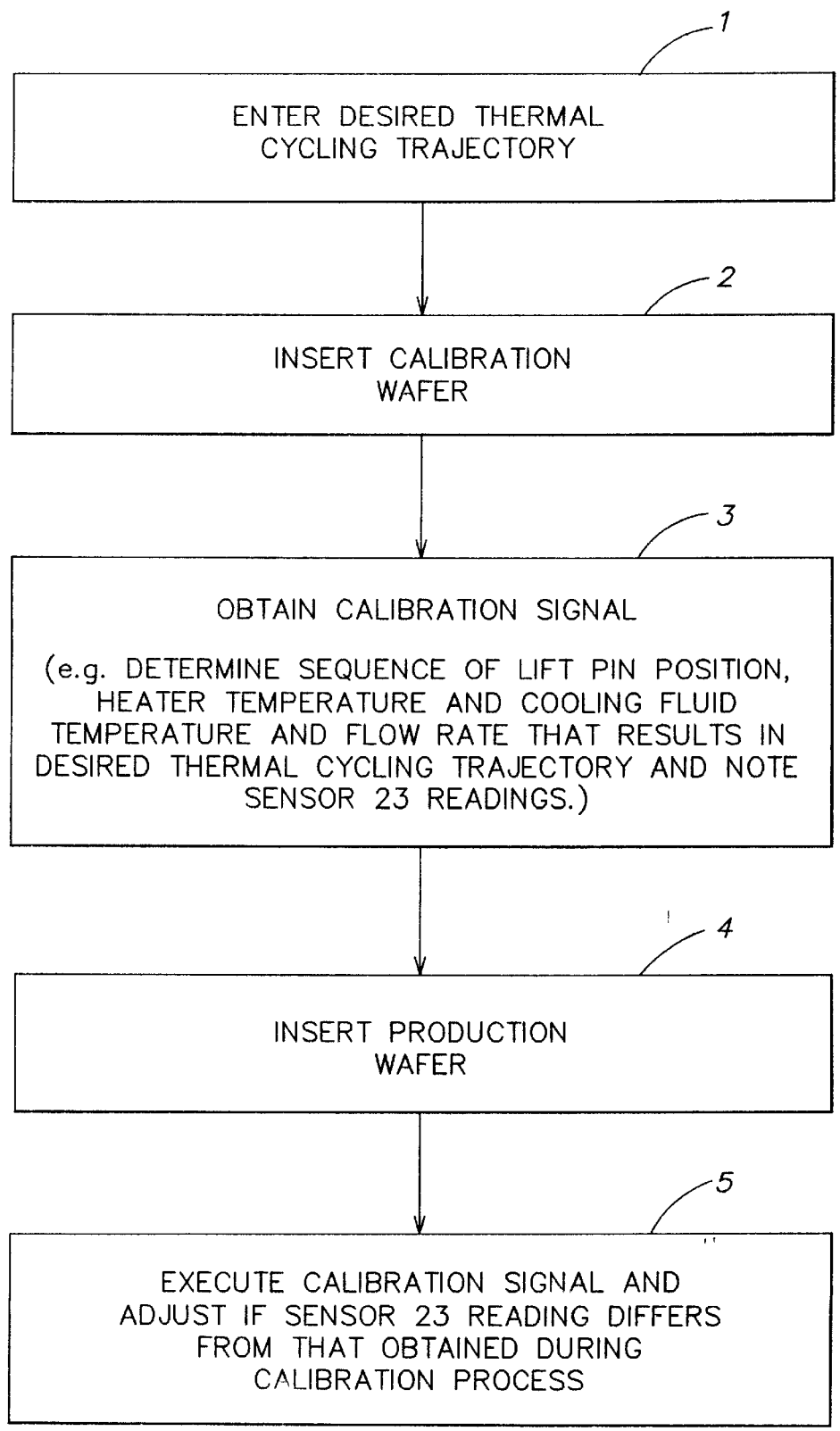
FIG. 3 is a flow diagram useful in explaining the operation of the inventive control system.

FIG. 3 is a flow diagram useful in describing the operation of the inventive heater control system. In operation, a user either programs the controller 21 with the desired thermal cycling profile for processing the wafer 11, or selects a pre-programmed thermal cycling profile stored by the controller 21 (Block 1). Typically the desired thermal cycling profile is one that provides the most uniform heating across the surface of the wafer 11. Thereafter, a calibration signal for the desired thermal cycling profile is obtained by running one or more calibration wafers (Block 2) through various thermal cycles while simultaneously monitoring both the actual wafer temperature via sensors positioned along the surface of the calibration wafer, and the temperature of the heater 15 or the conductive plate 13 via the sensors 23. Accordingly, based on information received from the temperature sensors placed on the wafer 11, the controller 21 adjusts the heater temperature, the lift pin position and/or the fluid spray (if any) to achieve a desired thermal cycling profile.

The controller 21 records the temperature sensed by the temperature sensors 23 which are positioned on the heater 15 or, if the conductive plate 13 is employed, on the conductive plate 13. The temperature sensed by the sensors 23 is, therefore, indicative of the actual wafer temperature, and may be used during production processing to ensure that the desired wafer temperature is in fact achieved. The heater temperature, lift pin position, and fluid spray (time, flow rate and temperature) required to achieve the desired thermal cycling profile are also recorded. These recorded values, in addition to the temperatures sensed by the temperature sensors 23, comprise the calibration signal for the specific heater control system (Block 3). This calibration signal is executed (e.g., the recorded heater, lift pin and fluid spray operations are repeated) during production processing. If, however, during production processing the temperature sensed by the sensors 23 varies from that sensed during the calibration process, the controller 21 dynamically adjusts the heater temperature, the fluid spray and/or the lift pin position, until the temperature sensed by the sensors 23 corresponds to the temperature sensed by the sensors 23 during the calibration process (Block 5). Accordingly, the sensors 23 of the inventive heater control system perform the following functions: (1) they sense the heater/conductive plate temperature during the calibration process and use this temperature information as a calibration or target temperature during production processing (feed forward information); and (2) they sense the heater/conductive plate temperature during production processing, and use this temperature information to ensure that the desired wafer temperature is being achieved (feed back information).

Each inventive heater control system must be "calibrated" as described above for each desired thermal cycling profile in order to obtain a calibration signal therefor. During calibration a user may select a fast, medium, conventional or slow processing speed, and the controller 21 will adjust the outputs to the lift pins, the heater actuator and the fluid spray mechanism accordingly, as summarized in Tables 3-1through 3-4.

TABLE 3-1

Fast Operation Mode

| | |
|---|---|
| 1. | Preheat the heater to a specified temperature greater than the ultimate desired wafer temperature using heater actuator. |
| 2. | Place wafer on heater using lift pins. |
| 3. | Maintain heater temperature during wafer temperature ramp using heater sensors. |
| 4. | Apply fluid spray pulse by actuating fluid pump to cool heater and wafer to ultimate desried wafer temperature. |
| 5. | Manipulate heater temperature via heater actuator and fluid spray component to achieve desired wafer thermal cycling profile. |

TABLE 3-2

Medium Speed Operation Mode

| | |
|---|---|
| 1. | Preheat the heater to a specified temperature greater than the ultimate desired wafer temperature using heater actuator. |
| 2. | Place wafer on heater using lift pins. |
| 3. | Manipulate heater temperature via heater actuator and fluid spray component to achieve desired wafer thermal cycling profile. |

TABLE 3-3

Conventional Speed Operation Mode

| | |
|---|---|
| 1. | Preheat the heater to the ultimate desired wafer temperature using heater actuator. |
| 2. | Place wafer on heater using lift pins. |
| 3. | Maintain heater temperature. |

TABLE 3-4

Slow Speed Operation Mode

| | |
|---|---|
| 1. | Place wafer on cold heater using lift pins. |
| 2. | Manipulate heater temperature via heater actuator and fluid spray component to achieve desired wafer thermal cycling profile. |

Thus, when performing the calibration process, a user may select a fast, medium, conventional or slow speed operation. The controller which is programmed to adjust the inventive heater control system's operation as described in the above Tables, employs this adjusted operation during the calibration process. The adjusted operating speed is therefore incorporated in the calibration signal which is executed during production processing, as described above with reference to FIG. 3. The ability to select operating speed allows a user to customize operation, and provides significant throughput increases when the fast operating speed is selected.

The foregoing description discloses only the preferred embodiments of the invention, modifications of the above disclosed apparatus and method which fall within the scope of the invention will be readily apparent to those of ordinary skill in the art. For instance, a plurality of heater actuators may be employed. In addition, the sensors 23, (e.g., thermocouples, infrared sensors, etc.) may be disposed in other positions, so long as the temperature recorded thereby correlates to the temperature of the wafer. The cooling mechanism may be cooling fluid channels such as those disclosed in parent application Ser. No. 09/377,365, cooling fins such as those disclosed in U.S. patent application Ser. No. 09/432,287, filed Nov. 2, 1999, or any conventional cooling mechanism. Finally, it will be understood by those of ordinary skill in the art, that specific orientations of components and order of processing steps provided herein are merely exemplary of the presently preferred embodiment of the invention, and the invention is not to be limited thereby.

Accordingly, while the present invention has been disclosed in connection with the preferred embodiments thereof, it should be understood that other embodiments may fall within the spirit and scope of the invention, as defined by the following claims.

The invention claimed is:

1. An apparatus adapted to thermally process a substrate, comprising:

a mechanism adapted to heat a substrate;

at least one temperature sensor mounted to the heating mechanism and adapted to sense a production temperature of the heating mechanism;

a lifting mechanism adapted to lift and lower a substrate above the heating mechanism; and a controller coupled to the heating mechanism, the temperature sensor and the lifting mechanism, and adapted to execute a calibration signal adapted to expose a substrate to a predetermined thermal cycling profile, the calibration signal comprising at least one calibration temperature to compare to the corresponding at least one production temperature sensed by the one or more temperature sensors;

wherein the controller is adapted to adjust the heating mechanism's temperature when the at least one corresponding calibration temperature and the at least one production temperature differ.

2. The apparatus of claim 1 wherein the heating mechanism is a heater and the at least one temperature sensor is mounted to the surface of the heater.

3. The apparatus of claim 2 further comprising a cooling mechanism operatively coupled to the heating mechanism;
wherein the controller is coupled to the cooling mechanism.

4. The apparatus of claim 3 wherein the cooling mechanism comprises at least one fluid spray nozzle adapted to spray fluid on the heating element.

5. The apparatus of claim 2 wherein the controller is further adapted to provide a selection between various operating speeds.

6. The apparatus of claim 1 wherein the heating mechanism comprises a heater and a thermally conductive plate, wherein the at least one temperature sensor is mounted to the surface of the thermally conductive plate.

7. The apparatus of claim 6 further comprising a cooling mechanism operatively coupled to the heating mechanism;
wherein the controller is coupled to the cooling mechanism.

8. The apparatus of claim 7 wherein the cooling mechanism comprises at least one fluid spray nozzle adapted to spray fluid on the heating element.

9. The apparatus of claim 6 wherein the controller is further adapted to provide a selection between various operating speeds.

10. A method of thermally processing a substrate, comprising:
providing a heating mechanism having at least one temperature sensor coupled thereto;
placing a calibration substrate having at least one temperature sensor coupled thereto, in thermal communication with the heating mechanism;
obtaining a calibration signal by exposing the calibration substrate to a predetermined thermal cycling profile by adjusting the temperature of the heating mechanism in accordance with temperature information obtained from the at least one temperature sensor coupled to the calibration substrate, and by recording at least the temperature information obtained from the at least one temperature sensor coupled to the heating mechanism;
placing a production substrate in thermal communication with the heating mechanism; and
adjusting the temperature of the heating mechanism in accordance with temperature information obtained from the at least one temperature sensor coupled to the heating mechanism thereby exposing the production substrate to the predetermined thermal cycling profile.

11. The method of claim 10 wherein providing a heating mechanism further comprises providing a heating mechanism having a cooling mechanism coupled thereto; and
exposing the production substrate to a predetermined thermal cycling profile comprises employing the cooling mechanism to adjust the temperature of the heating mechanism.

12. The method of claim 10 wherein exposing the production substrate to the predetermined thermal cycling profile comprises executing the calibration signal and adjusting the temperature of the heating mechanism when a temperature sensed by the at least one temperature sensor coupled to the heating mechanism during execution of the calibration signal differs from a corresponding temperature sensed by the at least one temperature sensor coupled to the heating mechanism during obtaining of the calibration signal.

13. The method of claim 12 wherein providing a heating mechanism further comprises providing a heating mechanism having a cooling mechanism coupled thereto, and exposing the production substrate to a predetermined thermal cycling profile comprises employing the cooling mechanism to adjust the temperature of the heating mechanism.

14. The method of claim 12 wherein providing a heating mechanism comprises providing a heater having at least one temperature sensor coupled thereto.

15. The method of claim 12 wherein providing a heating mechanism comprises providing a heater having a thermally conductive plate coupled thereto, the thermally conductive plate having at least one temperature sensor coupled thereto.

16. The method of claim 12 wherein obtaining a calibration signal by exposing the calibration substrate to the predetermined thermal cycling profile further comprises adjusting the temperature of the heating mechanism via application of a cooling fluid and recording the application of the cooling fluid.

17. The method of claim 12 wherein obtaining a calibration signal by exposing the calibration substrate to the predetermined thermal cycling profile further comprises adjusting the position of the calibration substrate relative to the heating mechanism.

18. The method of claim 16 wherein obtaining a calibration signal by exposing the calibration substrate to the predetermined thermal cycling profile further comprises adjusting the position of the calibration substrate relative to the heating mechanism.

19. The method of claim 10 wherein obtaining the calibration signal by exposing the calibration substrate to the predetermined thermal cycling profile comprises adjusting the temperature of the heating mechanism so as to alter the ramp rate of the calibration substrate's temperature.

20. The method of claim 12 wherein obtaining the calibration signal by exposing the calibration substrate to the predetermined thermal cycling profile comprises adjusting the temperature of the heating mechanism so as to alter the ramp rate of the calibration substrate's temperature.

21. The method of claim 16 wherein obtaining the calibration signal by exposing the calibration substrate to the predetermined thermal cycling profile comprises adjusting the temperature of the heating mechanism so as to alter the ramp rate of the calibration substrate's temperature.

22. The method of claim 17 wherein obtaining the calibration signal by exposing the calibration substrate to the predetermined thermal cycling profile comprises adjusting the temperature of the heating mechanism so as to alter the ramp rate of the calibration substrate's temperature.

23. The method of claim 18 wherein obtaining the calibration signal by exposing the calibration substrate to the predetermined thermal cycling profile comprises adjusting the temperature of the heating mechanism so as to alter the ramp rate of the calibration substrate's temperature.

24. A method of thermally processing a substrate, comprising:
providing a heating mechanism having at least one temperature sensor coupled thereto;
placing a calibration substrate having at least one temperature sensor coupled thereto, in thermal communication with the heating mechanism; and
obtaining a calibration signal by exposing the calibration substrate to a predetermined thermal cycling profile by adjusting the temperature of the heating mechanism in accordance with temperature information obtained from the at least one temperature sensor coupled to the calibration substrate, and by recording at least the temperature information obtained from the at least one temperature sensor coupled to the heating mechanism.

25. An apparatus adapted to thermally process a substrate, comprising:

a mechanism adapted to heat a substrate; and a controller coupled to the heating mechanism and adapted to execute a calibration signal adapted to expose a substrate to a predetermined thermal cycling profile, the calibration signal comprising at least one calibration temperature to compare to the corresponding at least one production temperature.

* * * * *